United States Patent [19]

Evans, Jr. et al.

[11] Patent Number: 5,593,914

[45] Date of Patent: Jan. 14, 1997

[54] METHOD FOR CONSTRUCTING FERROELECTRIC CAPACITOR-LIKE STRUCTURES ON SILICON DIOXIDE SURFACES

[75] Inventors: Joseph T. Evans, Jr.; Leonard O. Boyer, both of Albuquerque, N.M.

[73] Assignee: Radiant Technologies, Inc., Albuquerque, N.M.

[21] Appl. No.: 616,526

[22] Filed: Mar. 19, 1996

[51] Int. Cl.[6] ................................................. H01L 21/70
[52] U.S. Cl. .......................... 437/60; 437/47; 437/52; 437/919; 437/228; 148/DIG. 14
[58] Field of Search ............................ 437/47, 52, 60, 437/919, 228; 148/DIG. 14

[56] References Cited

U.S. PATENT DOCUMENTS

| | | | |
|---|---|---|---|
| 5,273,927 | 12/1993 | Gnasinger | 437/919 |
| 5,443,688 | 8/1995 | Toure et al. | 437/60 |
| 5,466,629 | 11/1995 | Mihara et al. | 437/919 |
| 5,491,102 | 2/1996 | Desu et al. | 437/919 |
| 5,519,235 | 5/1996 | Ramesh | 437/919 |

*Primary Examiner*—Tuan H. Nguyen
*Attorney, Agent, or Firm*—Calvin B. Ward

[57] ABSTRACT

A method for fabricating an integrated circuit having at least one integrated circuit component fabricated in a silicon substrate and a second device that is to be fabricated on a silicon oxide layer that covers the integrated circuit component. The integrated circuit component has a terminal that is to be connected a corresponding terminal on the second device. The second device includes an electrode structure in contact with a dielectric component that includes a layer of ferroelectric material. In the method of the present invention, a boundary layer comprising non-conducting polysilicon is deposited over the silicon oxide layer. The electrode structure is then fabricated by depositing one or more layers over the boundary layer. The ferroelectric layer is then deposited over the electrode structure and etched to provide the dielectric component. The boundary layer is then removed utilizing an etchant that etches silicon oxide much slower than polysilicon.

5 Claims, 6 Drawing Sheets

METHOD FOR CONSTRUCTING FERROELECTRIC CAPACITOR-LIKE STRUCTURES ON SILICON DIOXIDE SURFACES

FIELD OF THE INVENTION

The present invention relates to integrated circuits, and more particularly, to an improved method for constructing ferroelectric capacitors over, or adjacent to, conventional CMOS transistors.

BACKGROUND OF THE INVENTION

Ferroelectric capacitors or capacitor-like structures are of increasing interest in a number of integrated circuit applications. For example, as the feature size of DRAM memory cells is decreased in attempts to increase the density of DRAM based memories, the physical dimensions of the capacitors used to store the charge representing the data are also decreased. Since there is a minimum capacitance below which the DRAM cell will not operated satisfactorily, either a multilayer capacitor structure or a capacitor structure having an increased dielectric constant is needed. The former solution would substantially increase the cost of the memories; hence, there has been significant interest in utilizing capacitors with increased dielectric constants. Ferroelectric based capacitors based on lead zirconate titanate (PZT) that has been doped to be paraelectric at the operating temperature of the DRAMs have dielectric constants greater than 100. Hence, PZT-based capacitors are attractive candidates for replacing the conventional capacitors currently used in DRAMs.

Non-volatile memories based on PZT dielectric capacitors in which the dielectric is doped to be a ferroelectric at the operating temperature of the device have also attracted considerable interest because of the retention of the data in the absence of power. In addition, non-volatile memories based on a ferroelectric field effect transistor may also be used. Such a transistor structure is described in U.S. Pat. No. 5,070,385. This type of transistor may be viewed as a ferroelectric capacitor in which the top electrode is replaced by a semi-conductor layer having two contacts constructed thereon.

All of these memory cells require the construction of a ferroelectric capacitor adjacent to, or over, a CMOS transistor. In practice, the CMOS transistors are, constructed on a conventional silicon substrate and then covered with a silicon dioxide layer. The ferroelectric capacitor structures are then constructed on the $SiO_2$ layer. The ferroelectric capacitor construction requires that a multi-layer structure constructed over the $SiO_2$ layer be etched back to the $SiO_2$ layer in selected regions. The multi-layer structure includes layers of platinum and PZT based compounds. The preferred etchant is a dry plasma etch, since such etching systems do not undercut the electrodes of the ferroelectric capacitor.

To etch the ferroelectric oxides of interest, a combination of fluorine and chlorine must be used in the plasma. Such plasma etchants etch $SiO_2$ much faster than PZT compounds. Hence, any irregularities in the multi-layered structure will be transferred to the underlying $SiO_2$. Furthermore, these irregularities will be magnified in the process because of the faster etch rates in $SiO_2$. Such irregularities in the $SiO_2$ layer cause problems when subsequent metal layers are applied to connect the various components.

Broadly, it is the object of the present invention to provide an improved method for constructing a device having a ferroelectric layer that must be etched.

It is a further object of the present invention to provide a method for constructing a ferroelectric capacitor that allows the above described multi-layer stack to be etched leaving a flat $SiO_2$ layer in the etched regions.

It is a still further object of the present invention to provide a method for constructing a ferroelectric capacitor that allows the multi-layer stack to be etched using a dry plasma etch.

These and other objects of the present invention will become apparent to those skilled in the art from the following detailed description of the invention and the accompanying drawings.

SUMMARY OF THE INVENTION

Broadly, the present invention is a method for fabricating an integrated circuit having at least one integrated circuit component fabricated in a silicon substrate and a second device that is to be fabricated on a silicon oxide layer that covers the integrated circuit component. The integrated circuit component has a terminal that is to be connected to a corresponding terminal on the second device. The second device includes an electrode structure in contact with a dielectric component that includes a layer of ferroelectric material. In the method of the present invention, a boundary layer comprising non-conducting silicon is deposited over the silicon oxide layer. The electrode structure is then fabricated by depositing one or more layers over the boundary layer. The ferroelectric layer is then deposited over the electrode structure and etched to provide the dielectric component. The boundary layer is then removed utilizing an etchant that etches silicon oxide much slower than polysilicon.

DETAILED DESCRIPTION OF THE INVENTION

Figure 4:
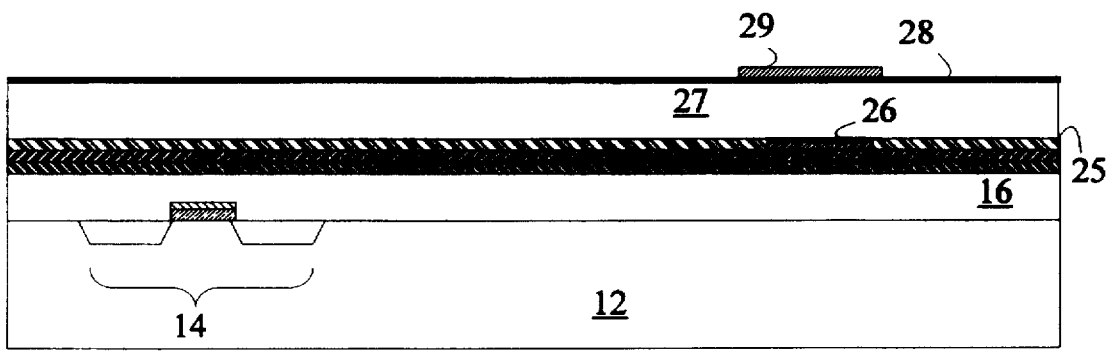
FIGS. 1–8 are cross-sectional views of an integrated circuit constructed comprising a CMOS transistor and a ferroelectric capacitor on one side of the CMOS transistor at various stages in the construction of the circuit.

The method of the present invention makes use of the experimental observation that fluorine and/or chlorine based plasma etch will attack polysilicon much slower than it attacks PZT and other ferroelectric oxides. The manner in which the present invention provides its advantages may be more easily understood with reference to FIGS. 1–8 which are cross-sectional views at various stages in the construction of a circuit comprising a ferroelectric capacitor connected to a CMOS transistor 14. The preferred ferroelectric is PNZT, since it has been shown that the addition of niobium doping reduces imprint problems in the capacitor.

In the preferred embodiment of the present invention, transistor 14 is first constructed on substrate 12 via conventional CMOS fabrication techniques. Since such construction is well known to those skilled in the art, this portion of the process will not be discussed further here. After transistor 14 is constructed, a SiO₂ layer 16 is deposited over the surface of the substrate. A thin non-conducting layer 17 of polysilicon is then deposited over SiO₂ layer 16. As will be explained in more detail below, polysilicon layer 17 will provide an etch stop that prevents later etching steps from substantially penetrating SiO₂ layer 16.

The thickness of layer 17 is determined by the etch rate differential of the regions to be etched and the maximal allowable step height in the final structure. The later factor is determined by the particular metal interconnect process being used to connect the components. The larger the etch rate differential, the greater the required thickness of the polysilicon layer. The etch barrier must be sufficiently thick to prevent the etch from penetrating under the fast etching regions during the periods in which the slow etching regions are being etched.

For example, consider the case in which the slow etching regions etch at 150 A° per minute; while the fast etching regions etch at a rate of 1500 at 150 A° per minute. If the upper layers are 3000 A° thick, then the etch will clear the fast regions in 2 minutes while the slow regions will require 20 minutes to clear. Hence, layer 17 must be able to withstand more than 18 minutes of etching without being penetrated. If layer 17 etches at 150 A° per minute, then it must be at least 3000 A° to prevent penetration.

The upper limit for the thickness of layer 17 is determined by the extra height added to the ferroelectric structure by the underlying boundary layer. The extra height must be covered at the steps by the metal interconnections. In general, step coverage is a major issue in IC fabrication; hence, it is advantageous to use as thin a layer 17 as possible. In the preferred embodiment of the present invention, layer 17 is 2000 A°.

The ferroelectric containing structure is then constructed on top of polysilicon layer 17. The preferred capacitor structure has a PNZT dielectric sandwiched between electrodes constructed from lanthanum strontium cobalt oxide (LSCO) and platinum with the LSCO in contact with the ferroelectric. The LSCO electrodes reduce the fatigue encountered when platinum electrodes are placed in contact with the PNZT layer. The platinum electrodes provide increased conductivity and structural integrity.

The bottom electrode is constructed by a depositing layer of TiO₂ which acts as a "glue" layer for attaching the bottom electrode to the polysilicon layer. A layer of metallic titanium is then deposited on the TiO₂ layer. The TiO₂ and metallic titanium layers are shown at 18 and 19, respectively, in FIG. 1.

Figure 3:
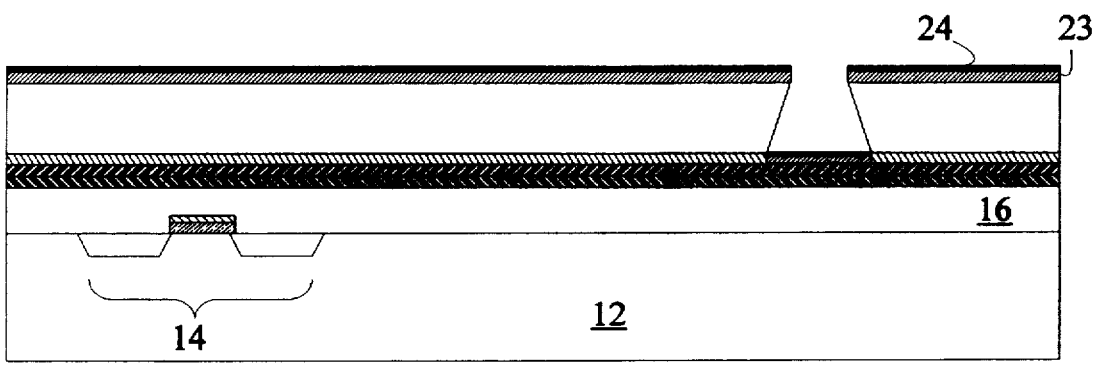
Figure 2:
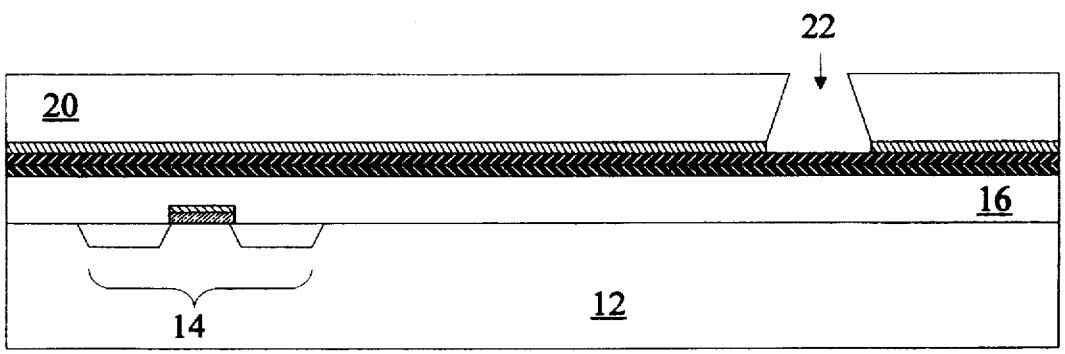
Figure 1:
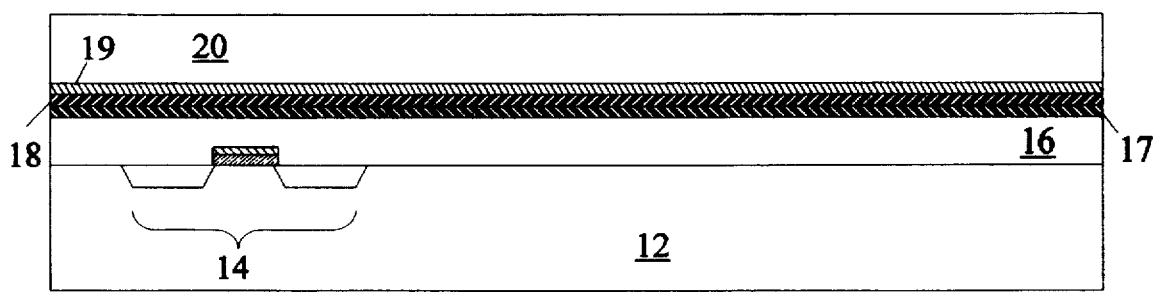

The bottom electrode is patterned by masking a layer of photoresist 20 which is deposited over titanium layer 19. An opening 22 in photoresist layer 20 defines the size and placement of the bottom electrode. Prior to depositing the bottom electrode layers, the metallic titanium is removed from the area defined by opening 22 by etching as shown in FIG. 2. This etching step may be accomplished with a CF₄ plasma etch or a 3:1:1 H₂O:HCL:BOE (buffered oxide etch). Layers of platinum 23 and LSCO 24 are then deposited on the substrate as shown in FIG. 3. The photoresist layer is then removed leaving behind the bottom electrode formed in the pattern of opening 22. It should be noted that a very thin layer(200 A°) of titanium may be deposited prior to the deposition of platinum layer 23 to improve the adhesion of the platinum to the underlying titanium oxide. This layer is converted to titanium oxide when the ceramic layer is 27 is fired.

Referring now to FIG. 4, the remaining areas of metallic titanium are exposed to oxygen at 550° C. to convert the remaining metallic titanium to TiO₂. This process leaves the bottom electrode 26 in a depression in a layer of TiO₂. This arrangement provides increased adhesion between the bottom electrode and the underlying substrate. In addition, the top surface of the bottom electrode is essentially flush with the surface of the surrounding TiO₂ layer. Hence, any variations in height of subsequent layers resulting from the bottom electrode are minimized.

The dielectric layer 27 is then deposited and crystallized. As noted above, the preferred dielectric is PNZT. The top electrode layers are then deposited. A layer of LSCO shown in 28 is deposited and annealed in oxygen to fully oxidize the layer. The platinum layer 29 is deposited with the aid of a lift-off mask. In principle, the LSCO and platinum can be deposited together with the lift-off mask in a manner analogous to that used in depositing the bottom electrode; however, it has been found experimentally that the method described above provides better adhesion between the platinum and LSCO layers.

Figure 5:
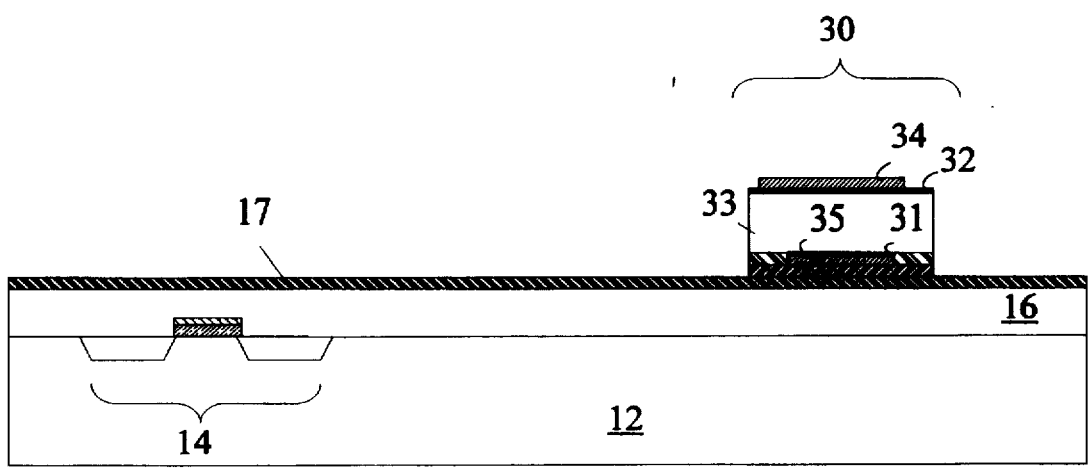

Refer now to FIG. 5. Capacitor 30 is created by stack etching the various layers described above using a plasma etch. Almost any combination of chlorine and fluorine will work. In addition, chlorine by itself will also etch the stack. The preferred etchant is CFC-124. The plasma etch is preferred because it does not under cut the platinum layer. Capacitor 30 is protected by a photoresist layer during the etching operation. The etch stops on the polysilicon layer 17 leaving a capacitor structure having a dielectric layer 33 sandwiched between LSCO electrodes 31 and 32. The LSCO layers are in turn sandwiched between platinum layers 34 and 35.

The capacitor is then covered with an interlayer dielectric(ILD) layer 40 which is preferably TiO₂/SiO₂ stack Layer 40 is deposited and then mask etched, again stopping on the boundary layer. Vias are then opened in layer 40 to provide access to the platinum portions of the electrodes. A typical via is shown at 41. The locations of the via to the bottom electrode will depend on the specific integrated circuit being fabricated. For example, in the case of a ferroelectric non-volatile memory, the bottom electrodes of all storage cells in a word are connected together and accessed by a single via at the end of the word.

Figure 7:
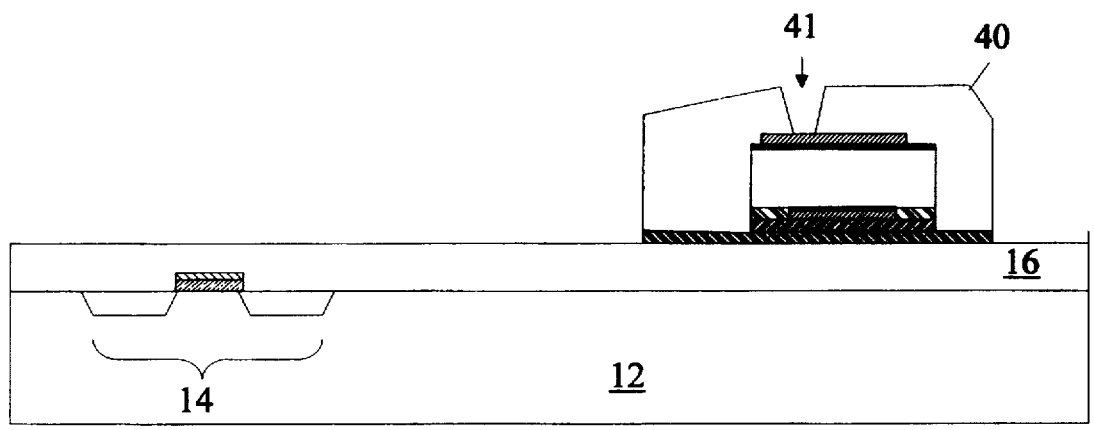
Figure 6:
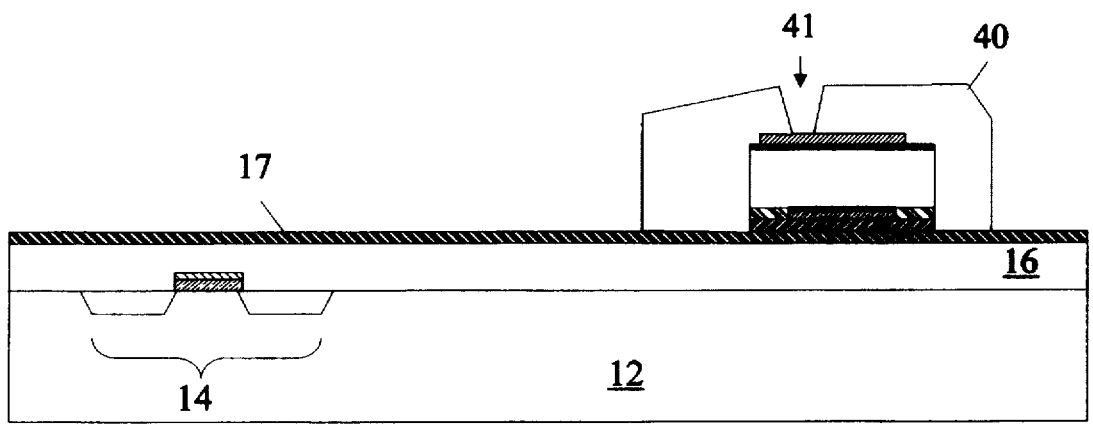

Refer now to FIG. 7. The polysilicon layer is then removed by etching with potassium hydroxide in a wet etch. It should also be noted that there are commercially available dry etches that may also be used for this purpose. This leaves the capacitor structure surrounded by the original SiO₂ layer. The polysilicon etch stops on SiO₂, hence, the process introduces minimal vertical variations in the surface of layer 16.

Figure 8:
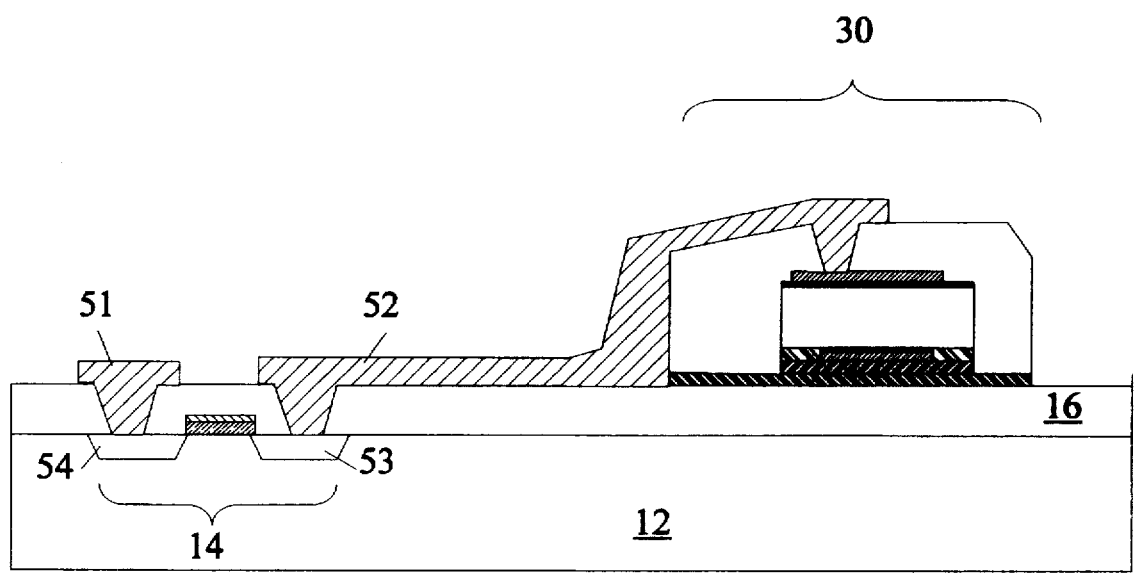
Figure 11:
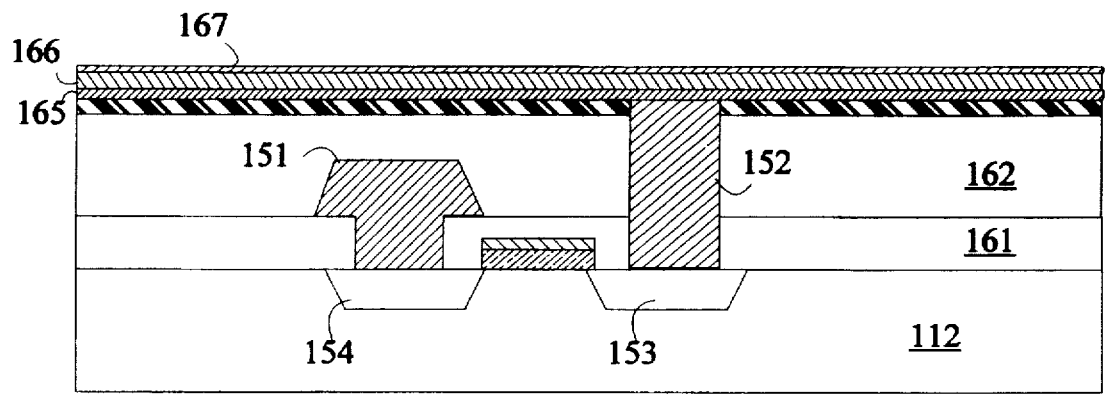
FIGS. 9–16 are cross-sectional views of an integrated circuit constructed comprising a CMOS transistor and a ferroelectric capacitor over the CMOS transistor at various stages in the construction of the circuit.

Finally, the metal connections between transistor 14 and capacitor 30 are deposited as shown in FIG. 8. Vias are first opened to the terminals 53 and 54 of transistor 14. A patterned metallic layer is then deposited to connect the top electrode of capacitor 30 to terminal 53 of transistor 14 as shown at 52. Connections to terminal 54 are shown at 51. Again, the specific connections will depend on the circuit being fabricated.

Figure 9:
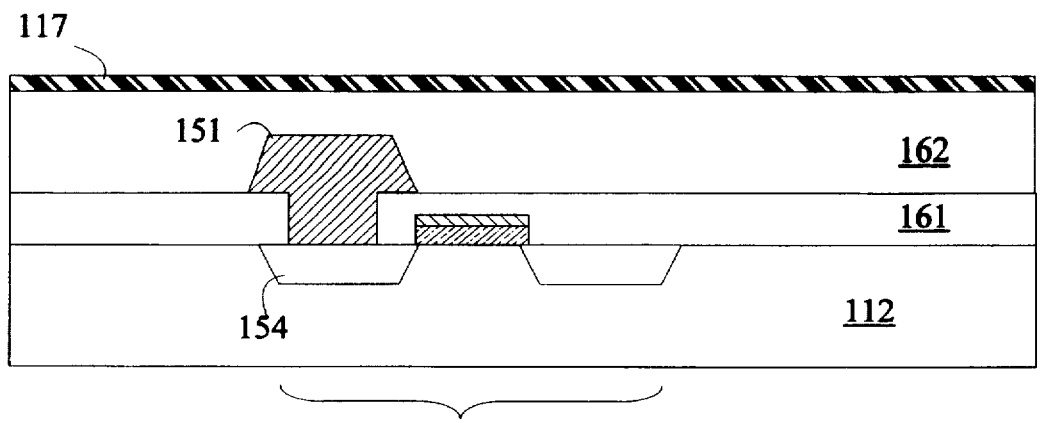

The etch barrier of the present invention may also be advantageously employed in constructing a capacitor over a transistor. Refer now to FIGS. 9–15 which illustrate the steps in the construction of a ferroelectric capacitor over a CMOS transistor 114. Referring to FIG. 9, the CMOS transistor 114 is constructed in a substrate 112 utilizing conventional CMOS fabrication techniques. A first SiO₂ layer 161 is deposited over substrate 112 and via cut to terminal 154 of CMOS transistor 114. The via is filled with a conductive polysilicon to form the connections to terminal 154 of transistor 114. A second SiO$_2$ layer 162 is then deposited over layer 161. An insulating polysilicon barrier is then deposited over layer 162 as shown at 117.

Figure 10:
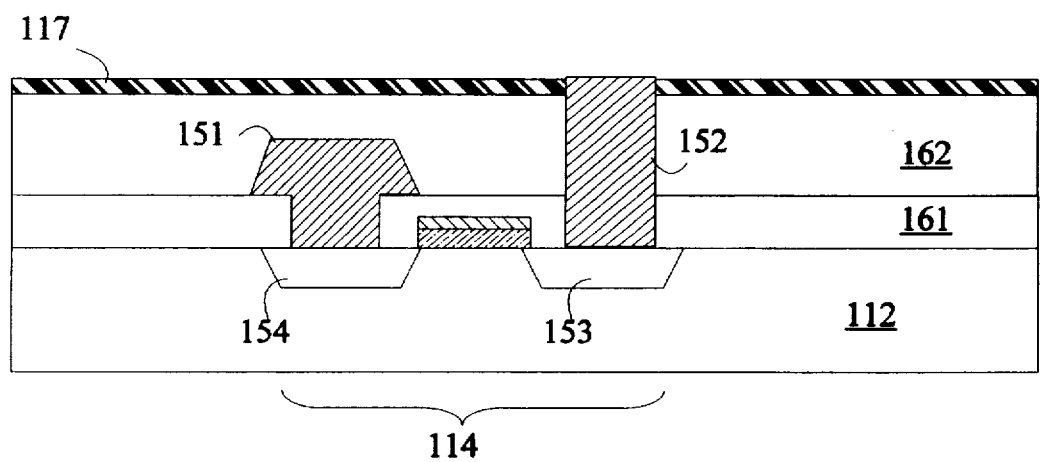
Figure 12:
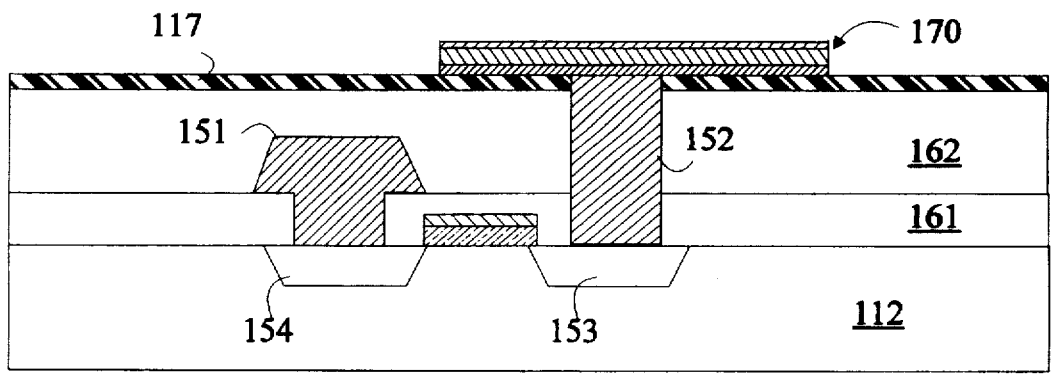

Referring now to FIG. 10, a via 152 is etched through layers 117, 161, and 162 and filled with conductive polysilicon. This polysilicon structure provides a connection to terminal 153 of transistor 114. A conductive isolation layer 165 such as TiN is then deposited over the polysilicon layer. The platinum and LSCO layers that will form the bottom electrode of the capacitor are then deposited over the conductive barrier as shown at 166 and 167. Layers 165–167 are then patterned and etched back to polysilicon layer 117 to form the bottom electrode 170 of the ferroelectric capacitor as shown in FIG. 12. This etch is preferably performed using ion milling. It should be noted that the bottom electrode can also be patterned using the lift-off process described above with reference to FIGS. 1–3. Ion milling is preferred because it can provide a smaller bottom plate structure.

Figure 13:
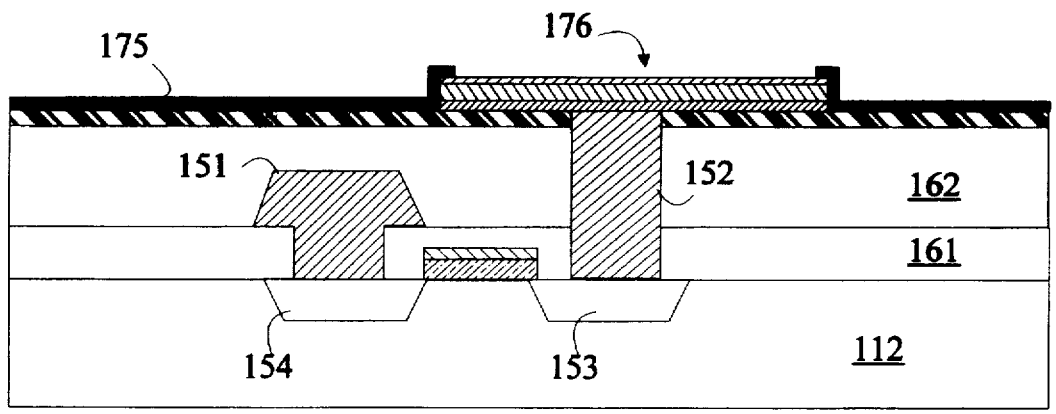

Refer now to FIG. 13. An insulating contamination barrier 175 is deposited over polysilicon layer 117 and bottom electrode 170. An opening 176 is then etched over bottom electrode 170. The preferred contamination barrier is TiO$_2$. The mask used to define opening 176 defines the active area of the bottom electrode.

Figure 14:
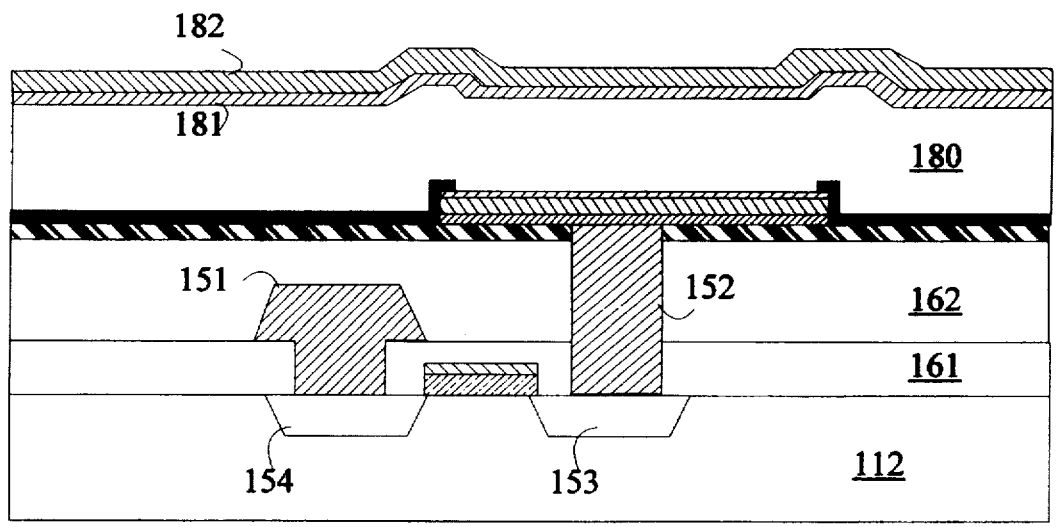
Figure 16:
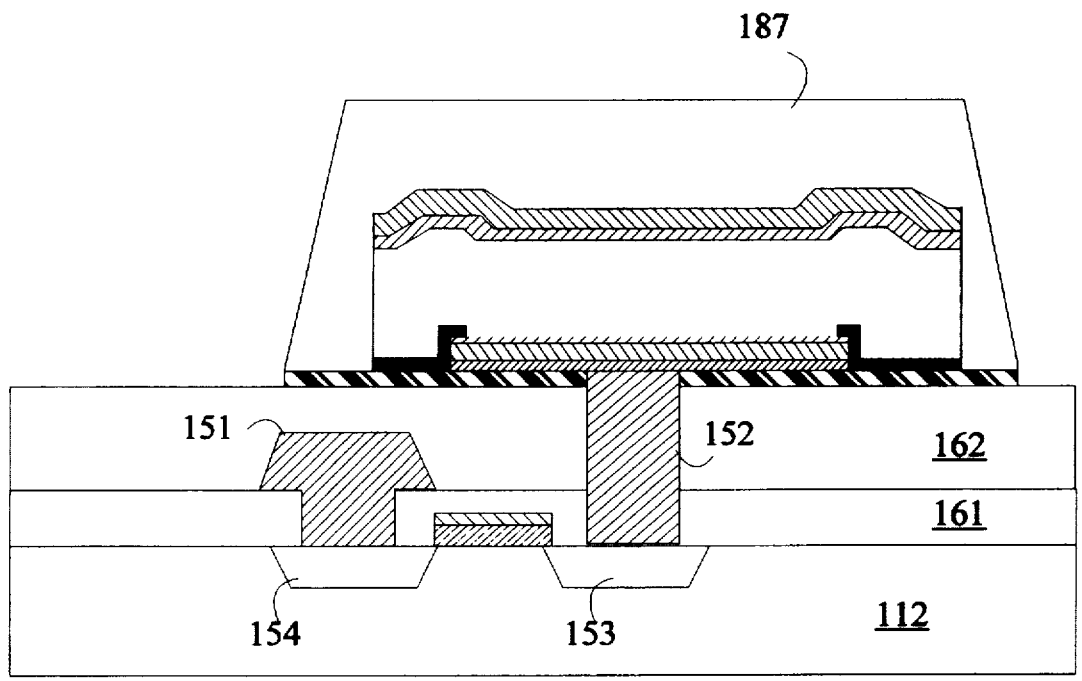
Figure 15:
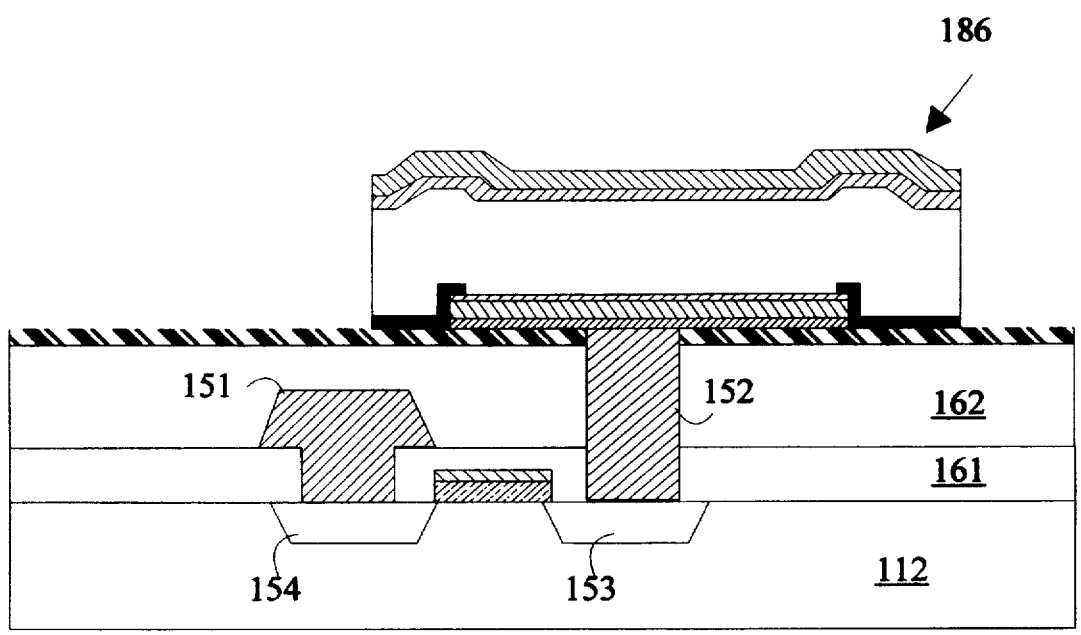

Refer now to FIG. 14. The ferroelectric layer 180 together with the layers that are to become the top electrode are deposited next. The top electrode is constructed from an LSCO layer 181 and a platinum layer 182. The stack comprising layers 180–182 is then plasma etched as described above to form the capacitor structure 186 shown in FIG. 15. Finally, an interlayer dielectric 187 is deposited over capacitor 186 and the polysilicon layer etched back to the surface of layer 162 to allow the various metalization layers to be deposited as shown in FIG. 16.

While the above embodiments of the present invention have been described in terms of a CMOS based circuit component in the underlying substrate, it will be apparent to those skilled in the art that the present invention may be applied to a wide variety of underlying circuit components. The present invention may be used in any situation in which a second circuit component is to be fabricated over an integrated circuit that has been previously fabricated in a substrate that is covered by silicon oxide.

While the above embodiments of the present invention have been described in terms of a second device which is a capacitor-like structure, other forms of second devices will also be apparent to those skilled in the art. The present invention may be utilized advantageously in any situation in which a chlorine or fluorine based plasma etch must be stopped before it penetrates an underlying layer.

While the present invention has been described in terms of specific etching processes, it will be apparent to those skilled in the art that any etchant that etches the ferroelectric material faster than polysilicon can, in principle, be used to advantage. In practice, the etchant must etch the ferroelectric material at least 1.5 times faster than the polysilicon. Similarly, there are a wide variety of etch processes that can be used to remove the polysilicon layer. In practice, the etchant for removing the polysilicon should etch polysilicon at least 2 times faster than it etches the underlying silicon dioxide.

While the present invention has been described in terms of a boundary layer comprising non-conduction polysilicon, it will be apparent to those skilled in the art that amorphous silicon can also be utilized as the boundary layer material, either alone or in combination with polysilicon. In addition, SiN could be used as the boundary layer material; however, SiN is a poor diffusion barrier and reacts with PZT; hence, this material is not preferred.

While the present invention has been described in terms of CMOS transistors in the underlying silicon wafer, it will be apparent to those skilled in the art that that the method of the present invention may be practiced with any underlying circuitry that must be protected with a layer of SiO$_2$. Similarly, it will be appreciated from the above discussion that the present invention does not depend on the specific nature of the ferroelectric device. The present invention may be used advantageously in the construction of any ferroelectric device in which a stack etch that must remove the ferroelectric layer over selected areas is employed.

Similarly, while the present invention has been described in terms of a ferroelectric layer comprising PZT, it will be apparent to those skilled in the art that the present invention may be used with other dielectric materials that present similar etching problems. For example, the present invention may be used to construct a capacitor having a ceramic dielectric comprising Barium Strontium Titanate (BST).

Various modifications to the present invention will become apparent to those skilled in the art from the foregoing description and accompanying drawing. Accordingly, the present invention is to be limited solely by the scope of the following claims.

What is claimed is:

1. A method for fabricating an integrated circuit comprising at least one integrated circuit component fabricated in a silicon substrate and a second device to be fabricated on a silicon oxide layer that covers said integrated circuit component, said integrated circuit component having a terminal that is to be connected a corresponding terminal on said second device, said second device comprising an electrode structure in contact with a dielectric component comprising a layer of ceramic material, said method comprising the steps of:

depositing a boundary layer comprising non-conducting silicon over said silicon oxide layer;

fabricating said electrode structure by depositing one or more layers over said boundary layer;

depositing said layer of ceramic material over said electrode structure;

etching said ceramic layer to provide said dielectric component utilizing an etchant that etches said ceramic material at least 1.5 times faster than polysilicon; and removing said boundary layer with an etchant that etches said boundary layer at least 2 times faster than silicon oxide.

2. The method of claim 1 wherein said boundary layer comprises a layer of polysilicon in contact with said layer of silicon oxide and a layer of a second material which is inert with respect to the bottom surface of said electrode structure.

3. The method of claim 2 wherein said second material comprises TiN.

4. The method of claim 2 wherein said second material comprises titanium oxide.

5. The method of claim 1 wherein said electrode structure comprises a layer of platinum underlying a layer of LSCO, said layer of platinum being in contact with said boundary layer.

\* \* \* \* \*

UNITED STATES PATENT AND TRADEMARK OFFICE
CERTIFICATE OF CORRECTION

PATENT NO. : 5,593,914
DATED : 01/14/97
INVENTOR(S) : Evans, et al.

It is certified that error appears in the above-indentified patent and that said Letters Patent is hereby corrected as shown below:

Col. 1, line 5:

AS FIRST PARAGRAPH: add "This invention was made with Government support under National Center for Advanced Information Component Manufacturing awarded by Advanced Research Projects Agency. The Government has certain rights in this invention."

Signed and Sealed this

Fifth Day of August, 1997

Attest:

BRUCE LEHMAN

*Attesting Officer*  *Commissioner of Patents and Trademarks*